(12) United States Patent
Takeuchi et al.

(10) Patent No.: US 6,822,170 B2
(45) Date of Patent: Nov. 23, 2004

(54) EMBEDDING RESIN AND WIRING SUBSTRATE USING THE SAME

(75) Inventors: Hiroki Takeuchi, Komaki (JP); Toshifumi Kojima, Komaki (JP); Kazushige Ohbayashi, Nagoya (JP); Hisahito Kashima, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 362 days.

(21) Appl. No.: 10/025,764

(22) Filed: Dec. 26, 2001

(65) Prior Publication Data

US 2002/0127418 A1 Sep. 12, 2002

(30) Foreign Application Priority Data

Dec. 26, 2000 (JP) ........................ P. 2000-395627
Mar. 23, 2001 (JP) ........................ P. 2001-83984

(51) Int. Cl.[7] ............................................... H05K 1/00
(52) U.S. Cl. ..................... 174/258; 174/260; 428/901
(58) Field of Search ............................ 174/255–260; 428/901; 361/750, 762, 809

(56) References Cited

U.S. PATENT DOCUMENTS

| 4,587,201 | A | * | 5/1986 | Morikawa et al. ............ 528/75 |
| 4,803,115 | A | * | 2/1989 | Fushiki et al. .............. 428/457 |
| 4,970,107 | A | * | 11/1990 | Akahoshi et al. ............ 428/457 |
| 5,412,002 | A | * | 5/1995 | Enomoto et al. .............. 528/98 |
| 6,166,131 | A | * | 12/2000 | Tashima et al. ........... 525/54.5 |
| 6,252,010 | B1 | * | 6/2001 | Takeuchi et al. .............. 528/28 |
| 6,693,162 | B2 | * | 2/2004 | Tsuji et al. .................. 528/170 |

FOREIGN PATENT DOCUMENTS

| JP | 9-46046 A | 2/1997 |
| JP | 11-126978 A | 5/1999 |
| JP | 2000-124352 A | 4/2000 |

OTHER PUBLICATIONS

English Abstract JP 9046046, Feb. 14, 1997.
English Abstract JP 2000124352, Apr. 28, 2000.
English Abstract JP 11126978, May 11, 1999.

* cited by examiner

Primary Examiner—Kamand Cuneo
Assistant Examiner—Jeremy Norris
(74) Attorney, Agent, or Firm—Sughrue Mion, PLLC

(57) ABSTRACT

In an embedding resin for embedding electronic parts, after a substrate in which a copper layer is formed on a cured product of the embedding resin is subjected to a pressure cooker test, the copper layer has a peeling strength of at least 588 N/m (0.6 kg/cm), wherein the conditions of the pressure cooker test are 121° C., 100% by mass humidity, 2.1 atm and 168 hours, and the measurement method of the peeling strength is according to JIS C 5012, and the width of the copper layer is 10 mm.

10 Claims, 9 Drawing Sheets

EMBEDDING RESIN AND WIRING SUBSTRATE USING THE SAME

BACKGROUND OF THE INVENTION

1. Field of the Invention

The present invention relates to an embedding resin for embedding electronic parts such as chip capacitors, chip inductors, chip resistances, etc., in the inside of a substrate and to a wiring substrate (i.e., wiring board) having embedded electronic parts in the inside of the substrate. Particularly, the invention is suitable for a multilayer wiring substrate having formed fine wiring layers having a width of not wider than 150 μm on the embedding resin, a package for containing (receiving) a semiconductor element, etc.

2. Description of the Related Art

Recently a multichip module (MCM) mounting many semiconductor elements on a build-up wiring substrate has been investigated. In the case of mounting electronic parts such as chip capacitors, chip inductors, chip resistances, etc., it is general to surface-mounting the electronic parts on a wiring layer for mounting formed on the surface of a wiring substrate using a solder.

However, when electronic parts are surface-mounted on the surface of a build-up wiring substrate, definite mounting area for various electronic parts is required, whereby there is, as a matter of course, a limit for the miniaturization. Also, by treating a wiring in the case of carrying out surface-mounting, the occurrence of a parasitic inductance, which is undesirable for characteristics, is increased and there is a problem that the correspondence of electronic instruments to high frequency becomes difficult.

For solving these various problems, various methods of embedding electronic parts in the inside of a substrate have been investigated. For example, Japanese Patent Laid-Open No. 126978/1999 discloses a method of, after previously solder-mounting electronic parts to a wiring substrate having a transfer sheet made of a metal foil, transferring the electronic parts, but, there remains a problem in the position precision, etc., at mounting. Also, Japanese Patent Laid-Open No. 124352/2000 disclosed a multilayer wiring substrate obtained by build-upping an insulating layer on electronic parts embedded in the inside of a core substrate.

For embedding electronic parts disposed in a wiring substrate in the inside of the substrate, it is necessary to embed the gaps among the core substrate and the electronic parts with the resin and electrically connecting the electrodes of the electronic parts to the wirings formed on the insulating layer by electroless plating, etc. In this case, by an ordinary embedding resin, the adhesion with a plated layer, which becomes the wiring, cannot sufficiently be insured to cause a problem of generating blister of plated layers, etc., in a reliability test. For example, even when the resin has a peeling strength exceeding 588 N/m in an initial state, but since by the influences of heat and moisture of the using environment, the peeling strength is deteriorated to become lower than 588 N/m, which gives a problem. Particularly, when a fine wiring layer having a width of not wider than 150 μm is formed On an embedding resin or when a wiring layer of passing a large electric current, such as a power source layer is formed, it become a remarkably severe problem.

For improving the adhesion of the embedding resin and the plated layer, a method of first embedding the electronic parts using the embedding resin, then after roughening the surface of the embedding resin with an oxidizing agent such as permanganic acid, chromic acid, etc., a wiring layer is formed by plating, and making build-up layer (forming multilayers) is considered. This is because by the anchoring effect of the unevenness of the roughened surface, the adhesive force with the plated wiring layer is increased. This is known as a method of improving the adhesion of the wiring layer of a build-up wiring substrate and the insulating layer. However, for an embedding resin, the manner of easily roughening is not utterly considered and by the above-described method, the remarkable improvement of the adhesion is hard to be expected.

SUMMARY OF THE INVENTION

An object of the invention is to provide an embedding resin, which increases the mounting density of a wiring substrate mounting thereon electronic parts and obtains a high reliability in a reliability test, such as a heat resistance, a water resistance, etc., and to provide a wiring substrate using the resin.

The embedding resin of the invention is an embedding resin for embedding electronic parts disposed in an opening (a throughhole) or a concave portion such as cavity, etc., formed in a substrate, wherein the peeling strength of a copper layer after a pressure cooker test (121° C., 100% by mass (by weight) humidity, 2.1 atm and 168 hours) of the substrate having formed the copper plate on the cured product of the embedding resin is at least 588 N/m (0.6 kg/cm). The peeling strength after the pressure cooker test (121° C., 100% by mass humidity, 2.1 atm, and 168 hours) is more preferably at least 700 N/m (0.71 kg/cm). Since even by testing under such conditions, the peeling strength still insures the values of at least 588 N/m (0.6 kg/cm), even when a fine wiring layer having a width of not larger than 150 μm is formed on the embedding resin and even when a wiring layer passing a large electric current, such as a power source layer is formed thereon, a high adhesive reliability can be insured.

In addition, the above-described electronic parts include passive electronic parts such as a chip capacitor, a chip inductor, a chip resistance, a filer, etc.; active electronic parts such as a transistor, a semiconductor element, FET, low-noise amplifier (LNA) etc., and other electronic parts such as a SAW filter, a Lc filter, an antenna switch module, a coupler, a diplexer, etc.

Also, in the embedding resin of the invention, it is preferred that the peeling strength of a copper layer in a pressure cooker test (121° C., 100% by mass humidity, 2.1 atm and 336 hours) of a substrate hating formed the copper layer on the cured product of the embedding resin is at least 600 N/m (0.61 kg/cm). Since even by testing under such a severe condition, the peeling strength still insures the values of at least 600 N/m (0.61 kg/cm), even when a wiring layer for a power source layer connected to electronic parts such as a capacitor having a power source supplying function is formed on the cured product of the embedding resin, a higher adhesive reliability can be insured.

The measurement method of the peeling strength is carried out according to JIS C 5012 (1993), and in this case, the width of the copper layer is 10 mm. The peeling strength of peeling the copper layer from the surface of the embedding resin to the direction of 90 degree (vertical direction) at a pulling speed of 50 mm/minute is measured.

In the embedding resin of the invention, for coloring the resin to a black-base while keeping the peeling strength of the copper layer after the pressure cooker test (121° C., 100% by mass humidity, 2.1 atm and 168 hours) at least 588 N/m (0.6 kg/cm), it is better to add carbon black in an amount of not more than 0.5% by mass, and preferably not more than 0.3% by mass. This is because the embedding resin can be colored to a black-base without reducing the adhesive reliability of the wiring layer at a high temperature and a high humidity and the volume resistance, which is the index of the insulating property.

Also, in the embedding resin of the invention, for coloring the resin to a black-base while keeping the peeling strength of the copper layer after the pressure cooker test (121° C., 100% by mass humidity, 2.1 atm and 336 hours) at least 600 N/m (0.61 kg/cm), it is better to add carbon black in an amount of not more than 0.4% by mass, preferably not more than 0.3% by mass, and particularly preferably not more than 0.2% by mass.

This is because by increasing the adhesion of the wiring layer at a high temperature and a high humidity, the occurrence of the causes of inferiorities such as blister in the production process of the wiring substrate is prevented, whereby the improvement of the yield and the improvement of the insulation reliability are obtained.

It is preferred that the embedding resin is colored to black for restraining the occurrence of irregular reflection at the light exposure for cutting a wiring pattern and for preventing the generation of color shading at curing the resin. However, when carbon black is compounding with the resin for coloring in black base in an amount of at least a definite amount, the heat resistance and the moisture resistance of the resin are lowered and the adhesive power with copper is lowered.

The embedding resin of the invention is comprised of a resin component and at least one kind of an inorganic filler. The inorganic filler is incorporated for controlling the thermal expansion coefficient and also by the effects as the skeleton of the three-dimensional structure after curing an epoxy resin and as the aggregate given by the inorganic filler, the form of the embedding resin after the roughening treatment is not crumbled more than usual.

There is no particular restriction on the inorganic filler used but crystalline silica, fused silica, alumina, silicon nitride, etc., are preferably used. Since such an inorganic filler can effectively lower the thermal expansion coefficient of the embedding resin, the occurrence of pealing of the resin by thermal stress is prevented and the reliability can be improved.

The particle size of the inorganic filler used is preferably not larger than 50 μm because it is necessary that the embedding resin also easily flows into gaps between the electrodes of the electronic parts. When the particle size of the filler exceeds 5 μm, the filler becomes liable to be clogged in the gaps between the electrodes of the electronic parts, and by inferior filling of the embedding resin, portions of extremely different in the thermal expansion coefficient locally generate. The lower limit of the particle size of the filler is preferably at least 0.1 μm. When the particle size of the filler is finer than 0.1 μm, the fluidity of the embedding resin becomes hard to be insured. Thus, the particle size of the filler is preferably at least 0.3 μm, and more preferably at least 0.5 μm. For attaining a low viscosity and a high filling of the embedding resin, it is preferred to widen the particle size distribution.

For increasing the fluidity and the filling of the embedding resin, the form of the inorganic filler is preferably an almost spherical form. In particular, a silica-base inorganic filler is preferred since the spherical filler can be easily obtained.

It is preferred that, if necessary, the surface of the inorganic filler is subjected to a surface treatment with a coupling agent. As the kind of the coupling agent, silane-base, titanate-base, aluminate-base, etc., are used.

For the embedding resin of the invention, on taking into consideration of the fluidity thereof, it is preferred to use at least one kind of a bisphenol epoxy resin or naphthalene type epoxy resin, which is a liquid epoxy resin, a phenolnovolac type epoxy resin, and a cresol novolac type epoxy resin as the indispensable resin component. When the fluidity of the embedding resin is inferior, inferior filling becomes liable to occur in the gaps between the electrodes of electronic parts, whereby the portions having extremely different thermal expansion coefficient are locally occurred. In the case of considering the heat resistance and the moisture resistance, a naphthalene type epoxy resin is particularly excellent.

The wiring substrate having embedded electronic parts using the embedding resin of the invention has an advantage that by the influences of heat and moisture in the using environment, the peeling strength of the wiring layer formed in the embedding resin is not deteriorated. Particularly, the wiring substrate is suitable in the case of forming a fine wiring layer having a width of not larger than 150 μm on the embedding resin and the case of forming a wiring layer passing a large electric current, such as a power source layer. Particularly, by improving the adhesion to the embedding resin of a wiring layer, which becomes a power source layer, when a large electric current is passed from a capacitor for power source supplying, the occurrences of selling of the wiring layer and the deterioration of the peeling strength of the wiring layer can be effectively prevented. The term "electronic parts are embedded" in the invention means that after disposing electronic parts in an opening (a throughhole (shown, for example, in FIG. 2)) or a concave portion such as cavity (shown, for example, in FIG. 10) formed in a substrate such as a core substrate or a build-up insulating layer, the embedding resin is filled in the gaps formed between the opening and the electronic parts. Particularly, in the case of using a thin core substrate having a thickness of not thicker than 400 μm, it is preferred to dispose electronic parts in a cavity formed in a build-up layer. It is preferred that for the opening, a throughhole formed by punching a substrate or a cavity, etc., formed by a multilayer-forming technique is utilized.

As the substrate, which is used in the invention, a so-called core substrate such as FR-4, FR-5, BT, etc., is preferably used but a core substrate formed by sandwiching a copper foil having a thickness of about 35 μm in thermoplastic resin sheets such as PTFE sheets, etc., and having formed an opening may be used. Also, a substrate formed by alternately laminating an insulating layer and a wiring layer on at least one surface of a core substrate to form a build-up layer and having formed an opening penetrating the core substrate and the build-up layer can be used. In this case, even a multilayer wiring substrate of a capacitor build-in type as shown in FIG. 11, the thickness of a so-called glass-epoxy composite material (insulating substrate) is thinned to about 400 μm, which is a half of 800 μm of an ordinary product, to make a low back substrate. As other example, a wiring substrate having electronic parts embedded in the inside of the core substrate (as shown, for example, in FIG. 1) and wiring substrate having electronic parts embedded in the inside of a build-up layer (as shown, for example, in FIG. 10) can be formed.

It is better that the thickness of a substrate of embedding therein electronic parts is as near as the thickness of the electronic parts to be embedded. In particular, it is preferred to establish the relation of the height of electronic parts and the thickness of the substrate such that the distance from the surface of the terminal electrode of the electronic parts to the wiring layer of the build-up layer laminated on the substrate becomes not longer than 100 µm (preferably not longer than 50 µm, and more preferably not longer than 30 µm). This is because by reducing the distance of the electronic parts to the build-up layer laminated on the substrate as small as possible, the generation of unnecessary parasitic capacities (inductance, etc.) can be prevented.

A multilayer wiring substrate, wherein a build-up layer formed by alternately laminating an insulating layer and a wiring layer is formed at least one surface of a core substrate, and a substrate having formed an opening such that the opening penetrates at least one of the core substrate and the build-up layer is used, may be produced, for example, as follows (FIG. 11 to FIG. 25).

Figure 1:
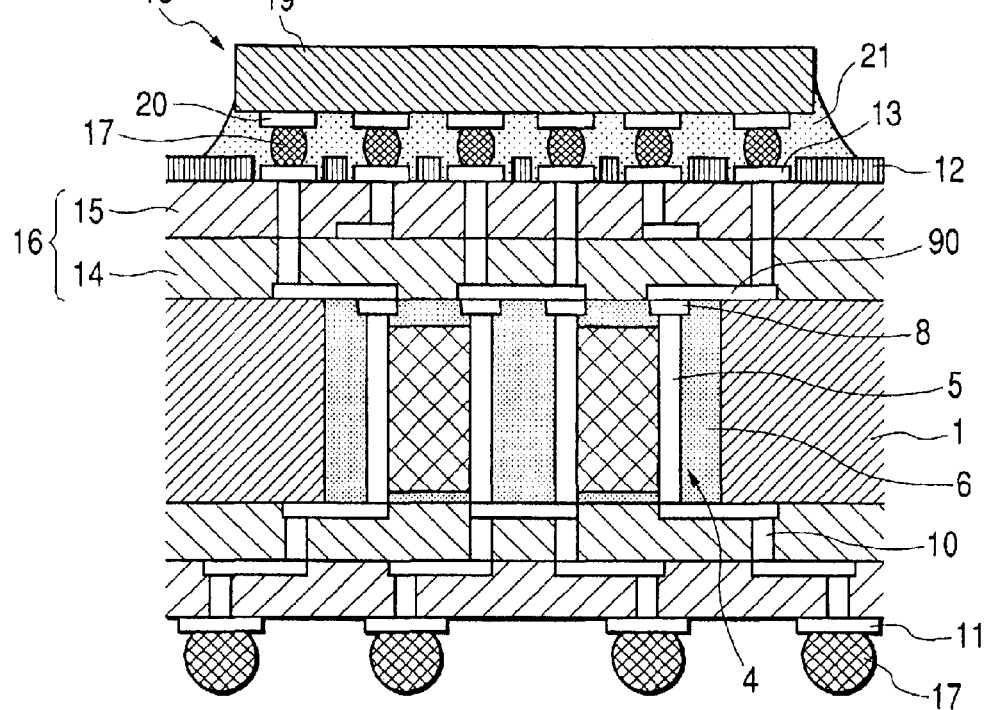
FIG. 1 is an explanatory view showing an example of applying the wiring substrate of the invention to a BGA substrate.

The description of the references numerals used in the drawing is set forth below.

| | |
|---|---|
| 1 | Core substrate |
| 2 | Throughhole (Opening) |
| 3 | Backing tape |
| 4 | Electronic parts |
| 5 | Electrodes of electronic parts |
| 6 | Embedding resin |
| 60 | Flatted surface |
| 61 | Roughened surface |

DETAILED DESCRIPTION OF THE INVENTION

Figure 12:
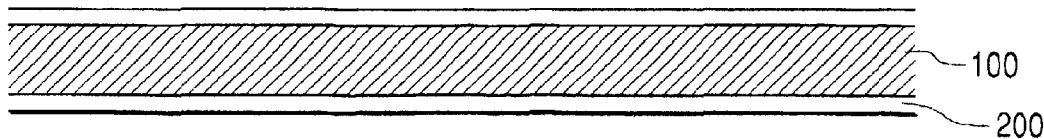
FIG. 12 is a schematic view of a 400 µm-thick copper-clad core substrate.

Now, the mode for carrying out the invention is explained below using an embodiment of so-called "FC-FGA". An FR-5-made double-sided copper-clad core substrate formed by sticking a copper foil (200) having a thickness of 18 µm to a core substrate (100) having a thickness of 0.4 mm as shown in FIG. 12 is prepared. About the characteristics of the core substrate used in the embodiment, the Ta (glass transition point) by TMA, is 175° C., the CTE (thermal expansion coefficient) in the substrate plane direction is 16 ppm/° C., the CTE (thermal expansion coefficient) in the direction vertical to the substrate plane is 50 ppm/° C., the dielectric constant ∈ in 1 MHz is 4.7, and the tan δ in 1 MHz is 0.018.

Figure 13:
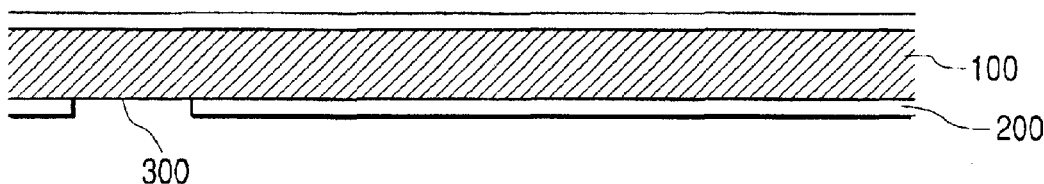
FIG. 13 is an explanatory view showing the state of after patterning a 400 µm-thick copper-clad core substrate.

A photoresist is stuck onto the core substrate followed by light exposure and development to form an opening (not shown) having a diameter of 600 µm and an opening (not shown) corresponding to a definite wiring form. The copper foil exposed to the opening of the photoresist is removed by etching using an etching solution containing sodium sulfite and sulfuric acid. Then, the photoresist film is removed by peeling to obtain the core substrate having formed the exposed portion (300) as shown in FIG. 13 and the opening (not shown) corresponding to the definite wiring form.

After surface-roughening the copper foil by applying an etching treatment using a commercially available etching treatment apparatus (CZ Treatment Apparatus, manufactured by Meck Co.), an insulating film made of an epoxy resin as the main body having a thickness of 35 μm is stuck to both surfaces of the core substrate. Also, the stuck films were cured under the conditions of 170° C.×1.5 hours to form insulating layers (400). About the characteristics of the insulating layer after curing, the Tg (glass transition point) by TMA is 155° C., the Tg (glass transition point) by DMA is 204° C., the CTE (thermal expansion coefficient) is 66 ppm/° C., the dielectric constant $\in$ in 1 MHz is 3.7, the tan δ in 1 MHz is 0.033, the weight loss at 300° C. is −0.1%, the water absorption is 0.8%, the moisture absorption is 1%, the Young's modulus is, 3 GHz, the tensile strength is 63 MPa, and the elongation percentage is 4.6%.

Figure 14:
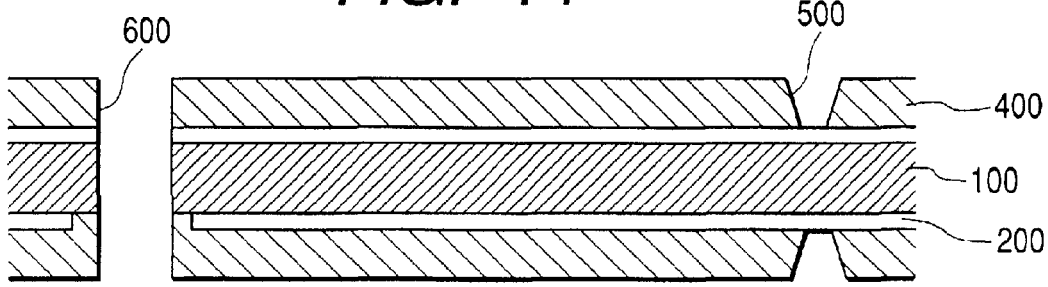
FIG. 14 is an explanatory view showing the state of forming via holes and a throughhole in a substrate having formed an insulating layer on both surfaces of the core substrate.

As shown in FIG. 14, using a carbon-dioxide gas laser, via holes (500) for interlayer connection are formed in the insulating layer (400). The form of the via hole is a cone shape having the diameter of the surface layer portion of 120 μm and the diameter of the bottom portion of 60 μm. Furthermore, by increasing the output of the carbon dioxide gas laser, a throughhole (600) having a diameter of 300 μm is formed such that the hole penetrates the insulating layers (400) and the insulating substrate (100). The inner wall surface of the throughhole has an undulation (not shown) specific to laser working. Also, after dipping the substrate in a catalyst activation liquid containing palladium chloride, electroless copper plating is applied to the whole surface (not shown).

Then, a copper panel deposition (700) having a thickness of 18 μm is plated on the whole surfaces of the substrate. Here, a via-hole conductor (800) electrically connecting between layers is formed on the walls of the via-hole (500). Also, a throughhole conductor (900) electrically connecting the front surface and the back surface of the substrate is formed on the wall of the throughhole (600). Then, by applying an etching treatment using a commercially available etching treatment apparatus (CZ Treatment Apparatus, manufactured by Mack Co.), the surfaces of the copper plating (depositions) are surface-roughened. Thereafter, by applying a rust-preventing treatment (CZ Treatment, trade name of Meck Co.) with a rust-preventing agent (manufactured by the same company), a hydrophobic surface is formed to complete the hydrophobic treatment. When the contact angle 2θ of the conductive layer surface subjected to the hydrophobic treatment to water was measured by a liquid drop method using a contact angle-measuring device (CA-A, trade name, manufactured by Kyowa Interface Science Co., Ltd.), the contact angle 2θ was 101 degree.

A nonwoven paper is placed on a pedestal equipped with a vacuum suction apparatus, and the above-described substrate is disposed on the pedestal. A stainless steel-made stopgap mask having a throughhole is placed thereon so that it corresponds to the position of the throughhole (600). Then, a paste for filling throughhole containing a copper filler is placed and while pressing a roller type squeegee, stopgap filling is carried out.

Figure 15:
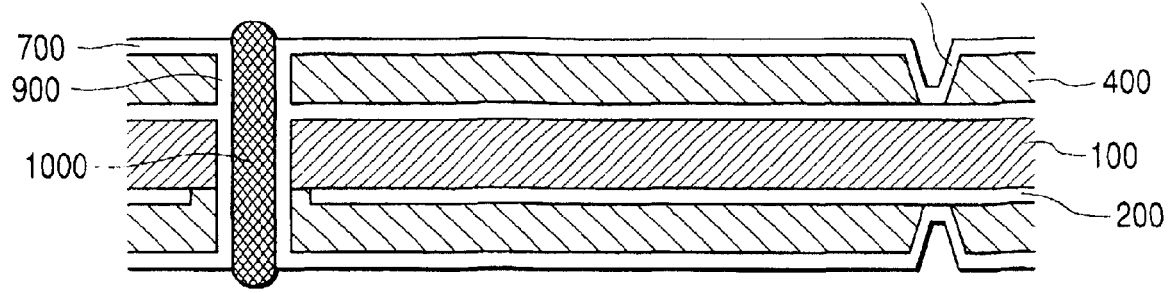
FIG. 15 is an explanatory view showing the state after applying panel plating to a substrate having formed an insulating layer on both surfaces of the core substrate.
Figure 16:
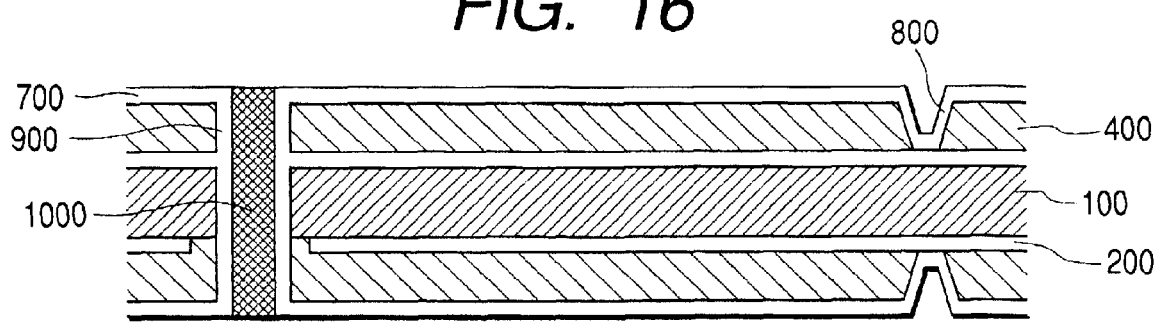
FIG. 16 is an explanatory view of a substrate wherein an embedding resin is filled in the throughhole.

As shown in FIG. 15, the throughhole-filling paste (1000) filled in the thorough hole (600) is pre-cured under the conditions of 120° C.×20 minutes. Then, as shown in FIG. 16, after abrading (rough abrading) the surface of the substrate using a belt sander, the surface is buffed (finish abrading) to flat the surface and cured under the conditions of 150° C.×5 hours to complete the stopgap step. In addition, a part of the substrate thus completed the stopgap step is used for the evaluation test of the stopgap property.

Figure 17:
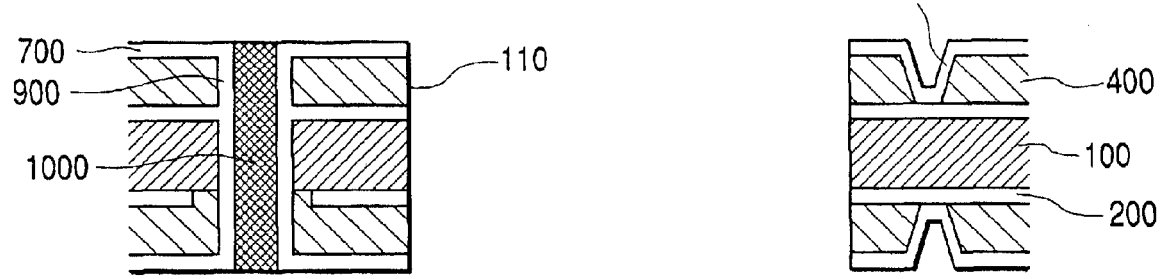
FIG. 17 is an explanatory view showing a substrate wherein a throughhole is formed by punching.

As shown in FIG. 17, a throughhole of 8 mm square (opening (110)) is formed using a metal mold (not shown).

Figure 18:
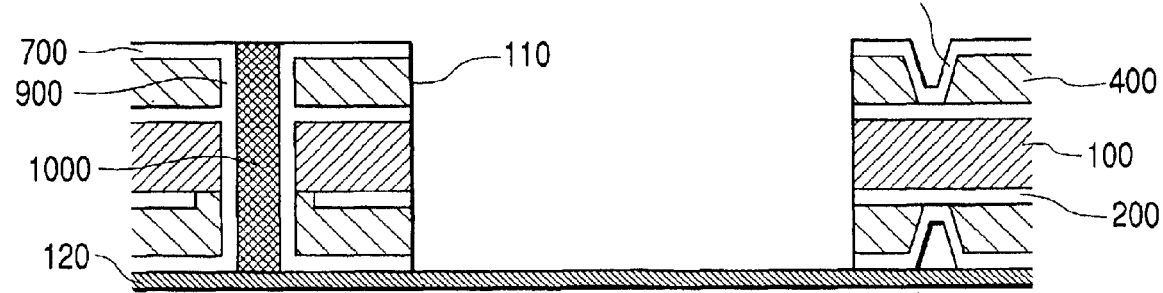
FIG. 18 is an explanatory view showing the state of sticking a masking tape to one surface of a substrate wherein a throughhole is formed by punching.
Figure 19:
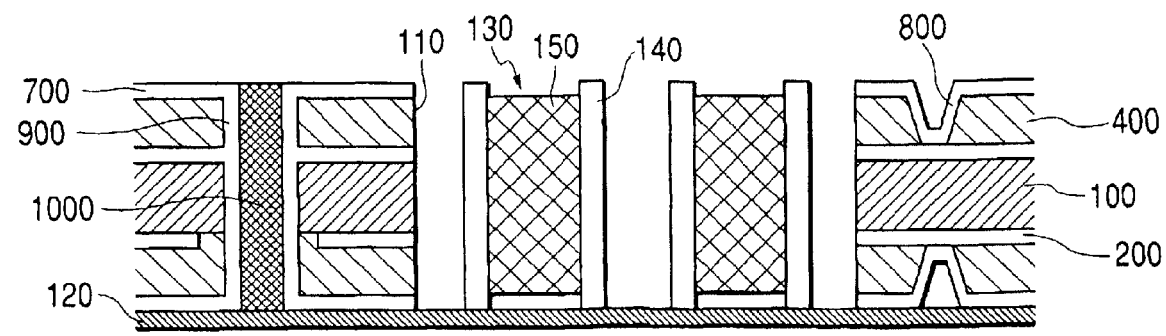
FIG. 19 is an explanatory view showing the state of disposing laminated chip capacitors on the masking tape exposed in the throughhole.

As shown in FIG. 18, a masking tape (120) is stuck to one surface of the substrate. Also, as shown in FIG. 19, eight laminated chip capacitors (130) are disposed on the masking tape exposed in the throughhole (110) using a chip mounter. The laminated chip capacitor is made of a laminate (150) of 1.2 mm×0.6 mm×0.4 mm and electrodes (140) are projected by 70 μm from the laminate.

Figure 20:
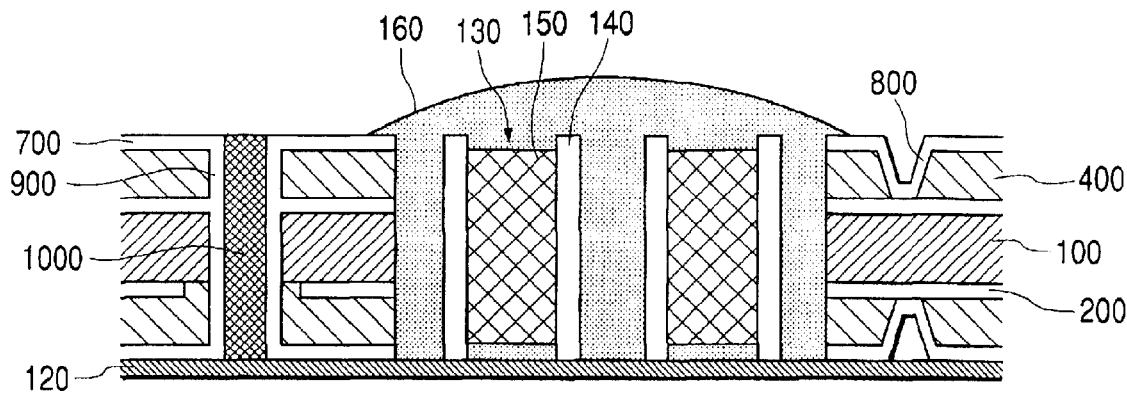
FIG. 20 is an explanatory view showing the state of filling the embedding resin in the throughhole.

As shown in FIG. 20, in the throughhole (110) having disposed therein the laminated chip capacitors (130), the embedding resin (160) of the invention is filled using a dispenser (not shown). The embedding resin is defoamed and thermally cured under the conditions of 80° C.×3 hours in the first heating step and 170° C.×6 hours in the second heating step.

Figure 21:
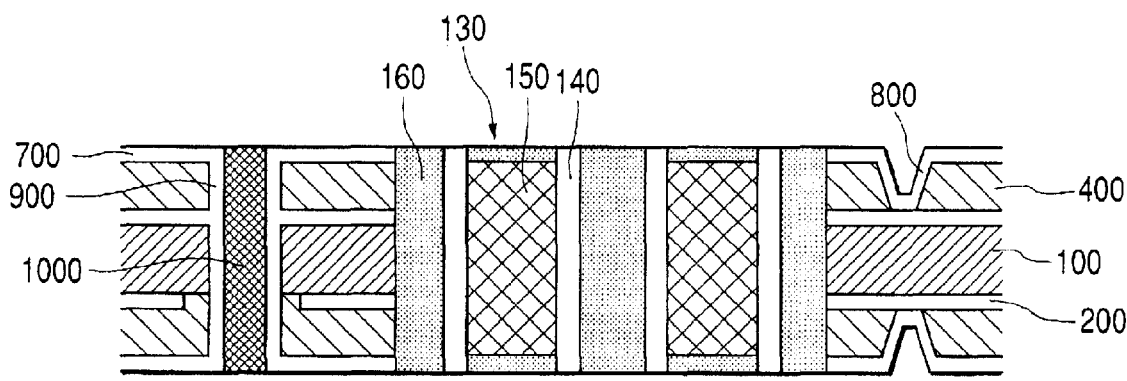
FIG. 21 is an explanatory view showing the state of flatted substrate surface by abrading.

As shown in FIG. 21, after roughly abrading the surface of the cured embedding resin (160) using a belt sander, the surface is finish-abraded by lap abrading. The end portions of the electrodes (140) of the chip capacitor (130) are exposed to the abrade surface. Then, the pre-cured embedding resin (160) is cured under the conditions of 150° C.×5 hours.

Figure 22:
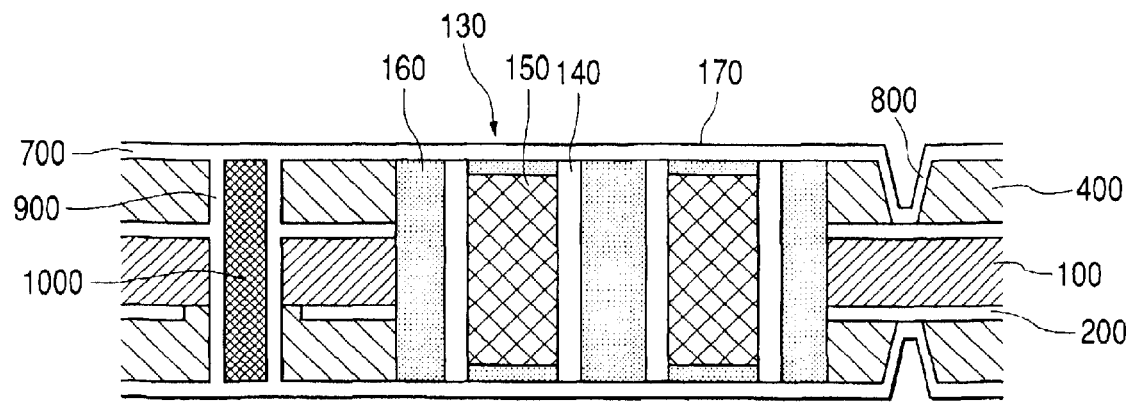
FIG. 22 is an explanatory view showing the state of applying panel plating onto the abraded surface of the substrate.
Figure 23:
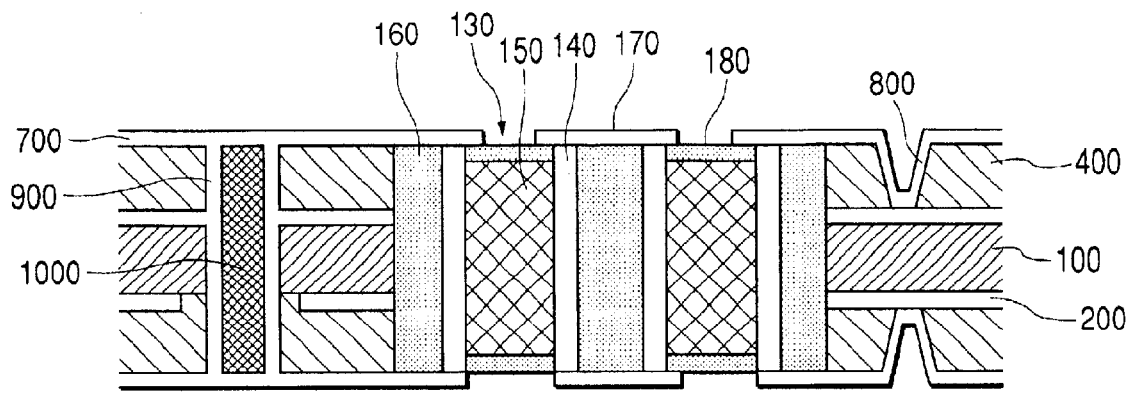
FIG. 23 is an explanatory view showing the state of patterning wiring.

Thereafter, the abraded surface of the embedding resin (160) is roughened using a swelling solution and a solution of $KMnO_4$. After Pt catalyst activating the roughened surface, copper plating is applied in the order of electroless plating and electrolytic plating. As shown in FIG. 22, the plated layer (170) formed on the embedding resin (160) is electrically connected to the end portions of the electrodes (140) of the chip capacitors (130). A resist (not shown) is formed on the plated surface and definite wiring patterns are formed thereon. Unnecessary copper is removed by etching using $Na_2S_2O_8$/concentrated sulfuric acid. The resist is peeled off to complete the formation of wiring as shown in FIG. 23. By applying an etching treatment by a commercially available etching treatment apparatus (CZ Treatment Apparatus, manufactured by Mack Co.), the copper-placed surface of wiring is roughened.

Figure 24:
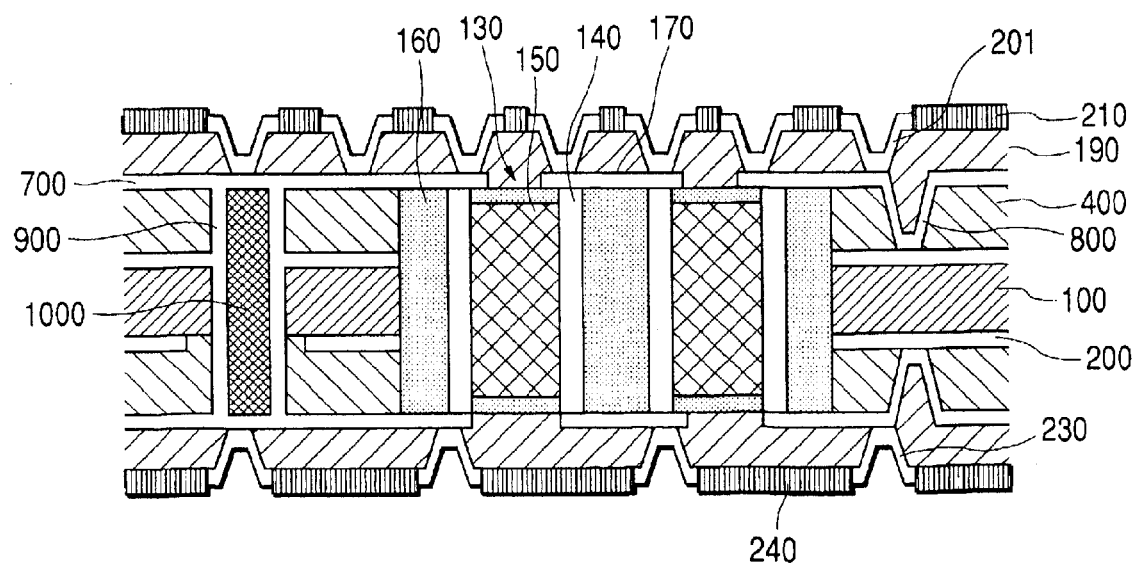
FIG. 24 is an explanatory view showing the state of forming a build-up layer and a solder resist layer on the substrate.

A film (190), which becomes an insulating layer, is laminated thereon and after thermally curing, a carbon dioxide gas laser is irradiated to form via holes for interlayer connection. The surface of the insulating layer is roughened using the same oxidizing agent as described above, and definite wirings (201) are formed by the same manner as described above. A dry film, which becomes a solder resist layer, is laminated on the uppermost surface of the wiring substrate, the mounting pattern of a semiconductor element is formed by light exposing and developing to complete the formation of a solder resist layer (210). On the back side to which pins for mounting are attached, a definite wiring (230) and a solder resist layer (240) are formed by the name method as above, whereby a multilayer printed wiring substrate before attaching pins as shown in FIG. 24 is obtained.

To terminal electrodes (201), onto which a semiconductor element is mounted, is applied plating (not shown) in the order of Ni plating and Au plating. After printing thereon a solder paste made of a low-melting solder, the substrate is passed through a solder reflow furnace to form solver bumps (220) for mounting a semiconductor element.

Figure 25:
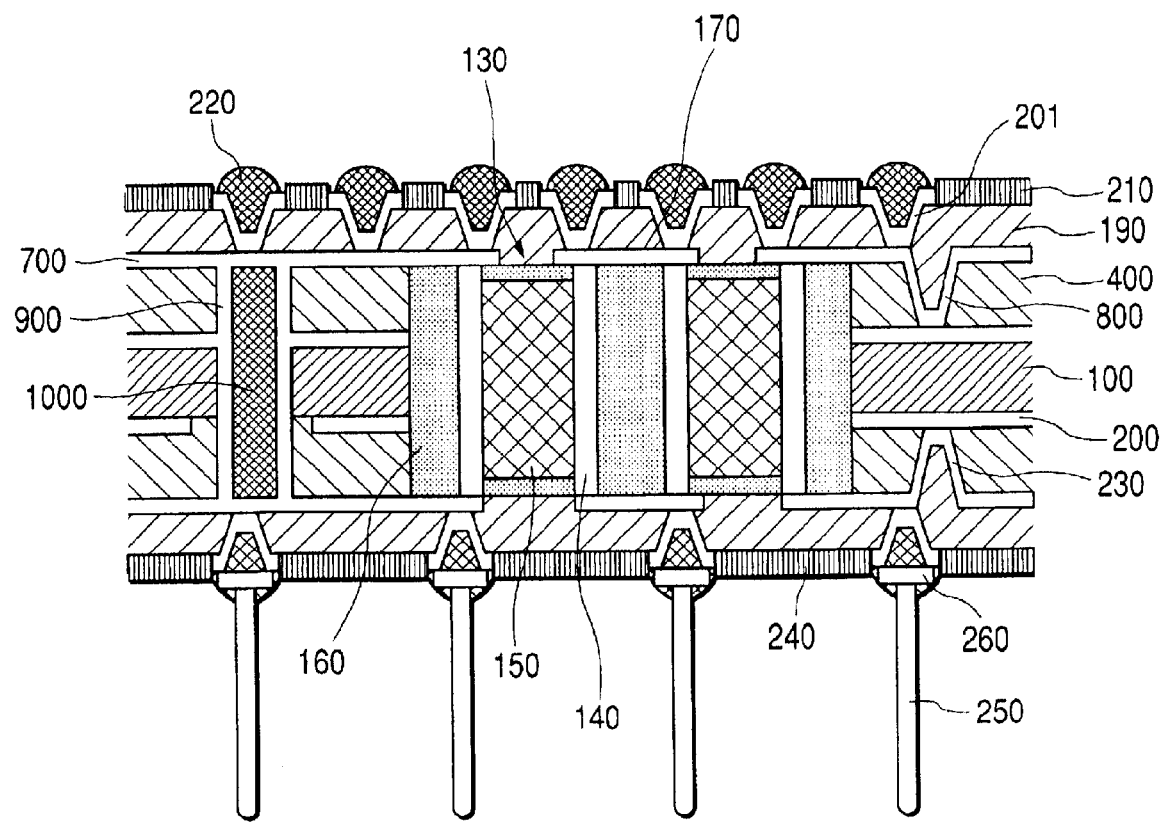
FIG. 25 is an explanatory view of an FC-PGA type multilayer printed wiring substrate, which is one embodiment of the invention.

On the other hand, on the opposite side of the semiconductor element-mounted surface, after printing a solder paste made of a high-melting solder, solder bumps (260) for attaching pins by passing through a solder reflow furnace are formed. In a state that the substrate is disposed one the pins (250) set to a jig (not shown), the pins are attached by passing through a solder reflow furnace (not shown), and, as shown in FIG. 25, an FC-PGA type multilayer printed wiring substrate before mounting a semiconductor element is obtained. When the positional deviation from the definite position of the tip of the pin (250) attached to the region corresponding to the opening (110) embedded with the embedding resin (160) was measured using a projector, a good result of not larger than 0.1 mm was obtained.

Figure 11:
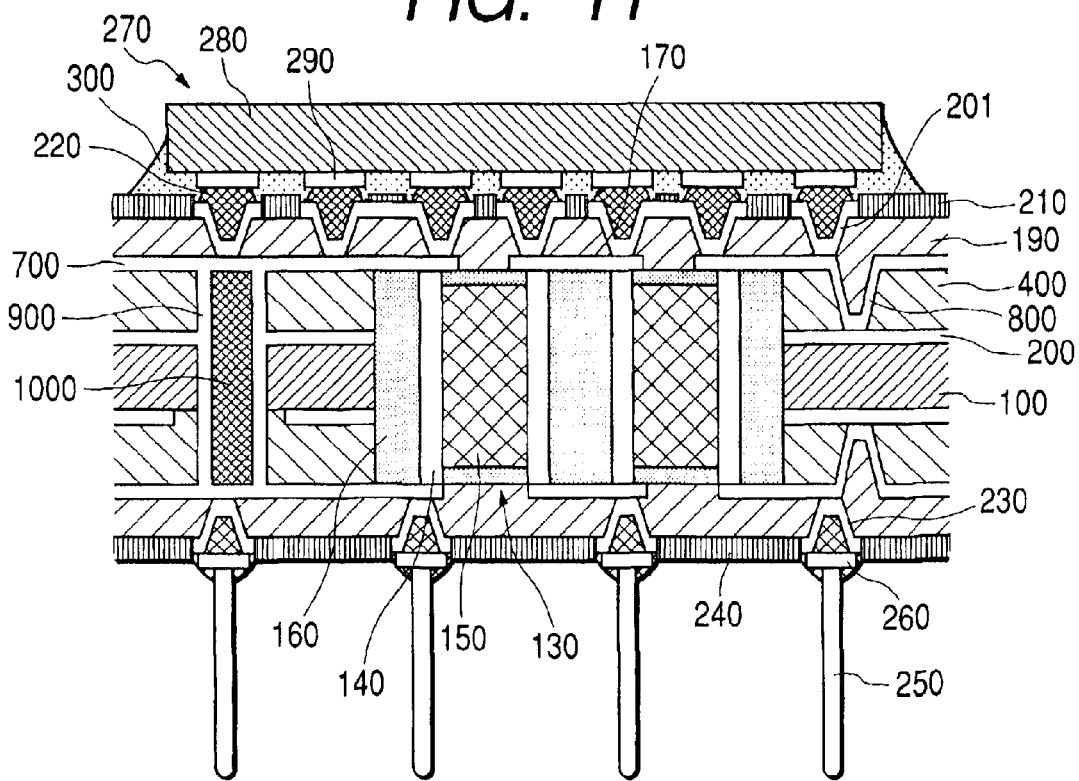
FIG. 11 is an explanatory view of a semiconductor device using an FC-PGA type multilayer printed wiring substrate, which is one embodiment of the invention.

A semiconductor element (270) is disposed on a semiconductor element-mounting surface at the position capable of mounting and the assembly is passed through a solder reflow furnace in a temperature condition of melting a low-melting solder (220) only to mount the semiconductor element (270). After filling the mounted portion with an under-filling material (300) by a dispenser, thermal curing is carried out to obtain a semiconductor device using the FC-PGA type multilayer printed wiring substrate having mounted on the surface thereof the semiconductor element as shown in FIG. 11.

Figure 2:
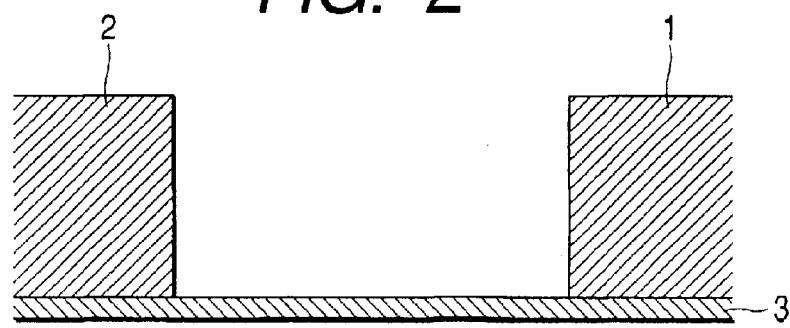
FIG. 2 is an explanatory view showing one embodiment of the production method of the wiring substrate of the invention.

By referring to FIG. 1 as an embodiment of the invention, other different wiring substrate of the invention is explained in detail. The wiring substrate can be produced by the following steps. As shown in FIG. 2, a throughhole (opening 2) having a definite size is formed in a core substrate (1) using a metal mold, and after sticking a backing tape (3) to one surface of the core substrate, the core substrate is placed with the surface having the backing tape at the lower side.

Figure 3:
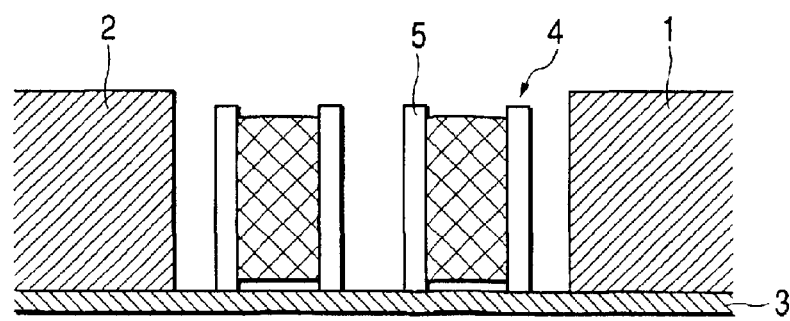
FIG. 3 is an explanatory view showing one embodiment of the production method of the wiring substrate of the invention.

As shown in FIG. 3, from another side of the core substrate, chip capacitors (4) are disposed on a definite position on the sticky surface of the backing tape (3) in the opening (2) using a chip mounter. As the chip capacitor used in the case, it is preferred to use a chip capacitor having electrodes (5) projected from the capacitor main body so that the embedding resin can easily fill.

Figure 4:
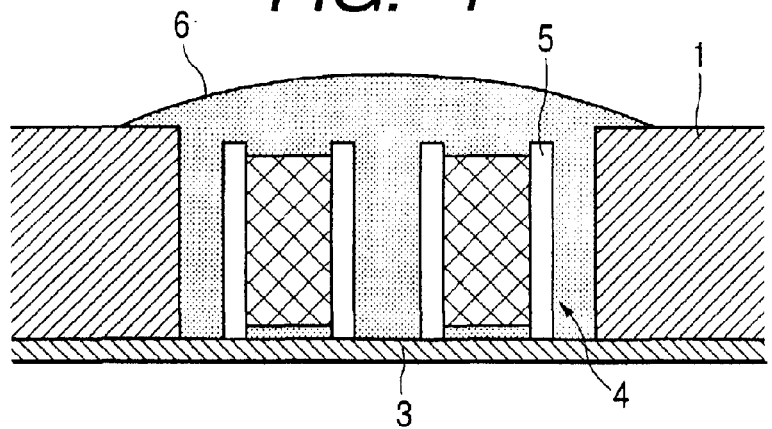
FIG. 4 is an explanatory view showing one embodiment of the production method of the wiring substrate of the invention.

As shown in FIG. 4, the embedding resin of the invention (6) is poured into the gaps among the chip capacitors (4) disposed in the opening (2) and the opening using a dispenser.

Figure 5:
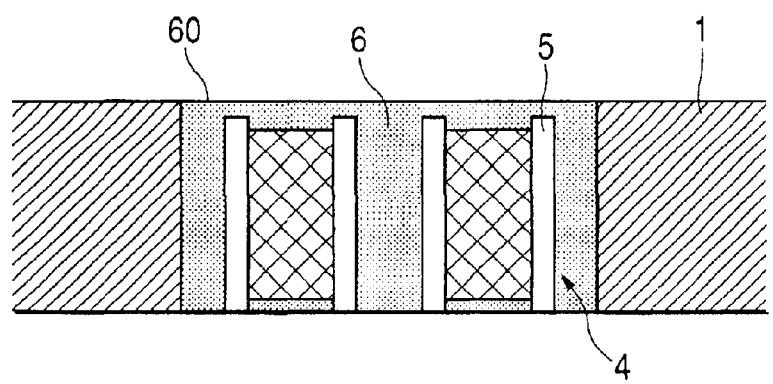
FIG. 5 is an explanatory view showing one embodiment of the production method of the wiring substrate of the invention.

The embedding resin (6) is defoamed and thermally cured under the conditions of 100° C.×80 minutes→120° C.×60 minutes→160° C.×10 minutes. After roughly abrading the surface of the cured embedding resin (6) using a belt sander, the surface was finish-abraded by a rap abrasion. The surface (60) of the embedding resin (6) the abrasion is shown in FIG. 5.

Figure 6:
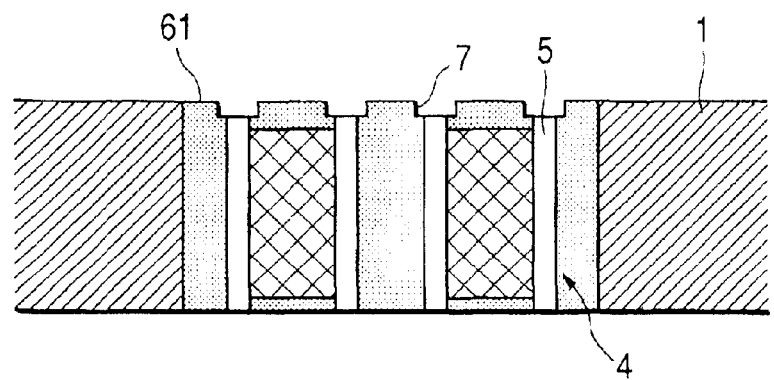
FIG. 6 is an explanatory view showing one embodiment of the production method of the wiring substrate of the invention.

Then, as shown in FIG. 6, via holes (7) are formed using a carbon dioxide gas laser to expose the electrodes (5) of the chip capacitors (4).

Figure 7:
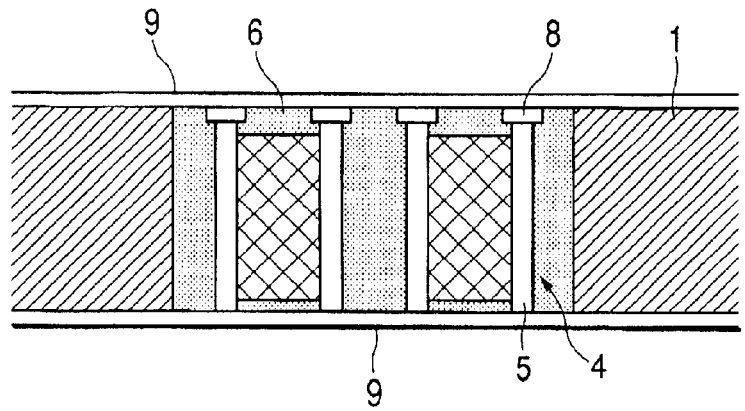
FIG. 7 is an explanatory view showing one embodiment of the production method of the wiring substrate of the invention.
Figure 8:
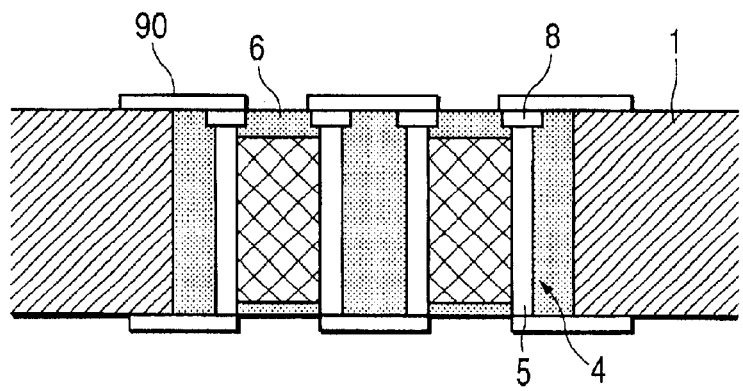
FIG. 8 is an explanatory view showing one embodiment of the production method of the wiring substrate of the invention.

Thereafter, using a swelling solution and a solution of $KMnO_4$, the exposed surfaces (61) of the embedding resin (6) are roughened. After Pd catalyst activating the roughened surface, copper pleating (9) is applied in the order of electroless plating and electrolytic plating. The state after copper plating is shown in FIG. 7. A resist (not shown) is formed on the plated surface and a definite wiring pattern is formed by patterning. Unnecessary copper is removed by etching using $Na_2S_2O_8$/concentrated sulfuric acid. The resist is peeled off to complete the formation of a wiring layer (90), which becomes a power source layer. The state after forming the wiring layer, which becomes a power source layer, is shown in FIG. 8. By improving the adhesion of the wiring layer (90), which becomes a power source layer, to the embedding resin (6), even when a large electric current from the capacitor (4) for power supplying is passed, the occurrences of blister of the wiring layer (90) and the deterioration of the peeling strength can be effectively prevented.

Figure 9:
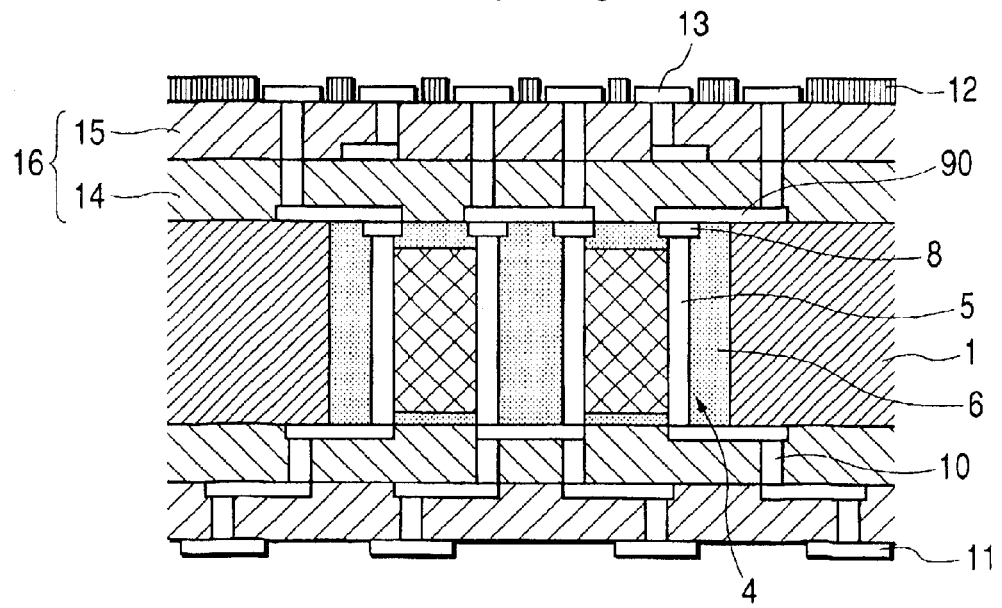
FIG. 9 is an explanatory view showing one embodiment of the production method of the wiring substrate of the invention.
Figure 10:
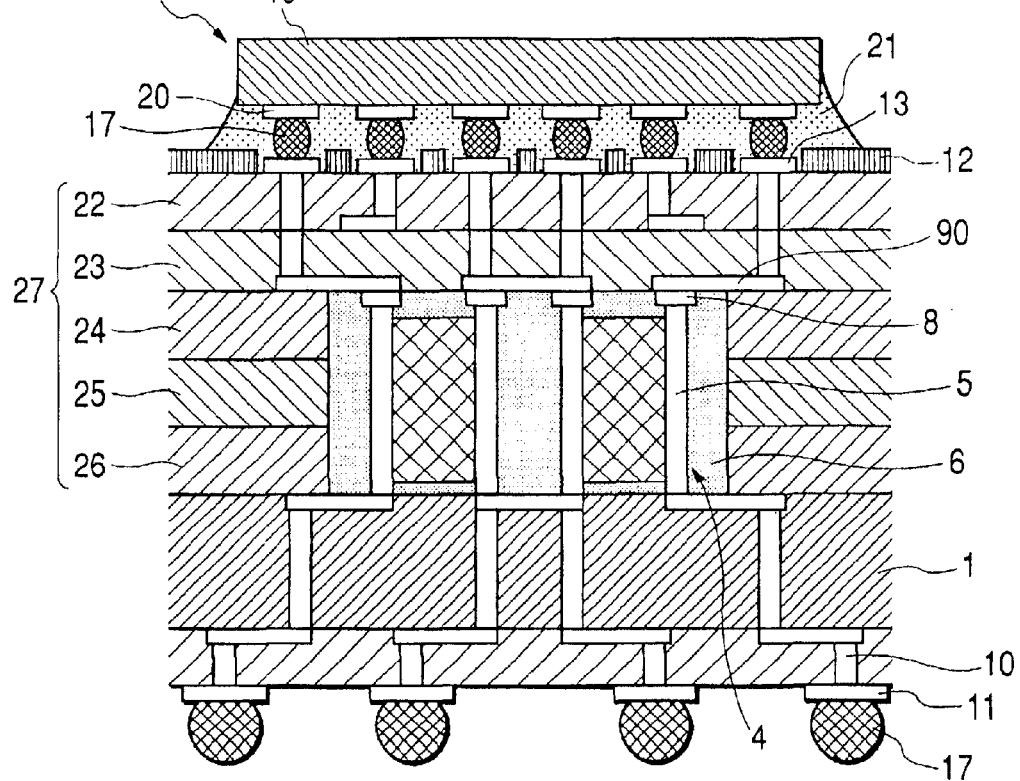
FIG. 10 is an explanatory view showing an example of applying the wiring substrate of the invention to a BGA substrate.

After laminating thereon films (14 and 15), which become insulating layers, and thermally curing, a laser is irradiated to form via holes for interlayer connecting. The surface of the insulating layer is roughened using the same oxidizing agent and then a definite wiring pattern is formed by the same manner as described above. A dry film, which becomes a solder resist layer, is laminated on the uppermost surface of the wiring substrate, the mounting pattern of a semiconductor element is formed by light exposing and developing to form a solder resist layer (12). The state is shown in FIG. 9. To the terminal electrodes (13) for mounting a semiconductor element, plating is applied in the order of Ni plating and Au plating.

Thereafter, By passing through a solder reflow furnace, a semiconductor element (18) is mounted. On the electrodes for carrying out mounting of the substrate, solder balls (17) are formed using a low-melting solder. After filling an under filling material (21) in the mounting portions by a dispenser, the material is thermally cured to complete the preparation of the desired wiring substrate as shown in FIG. 1.

Then, the effects by the wiring substrate of the present invention are explained by the examples using the substrate. The embedding resin is prepared by mixing the components such as the compositions shown in Table 1 are obtained and kneading the mixture by a triple roll mill. The details of the described matters in Table 1 are shown below.

TABLE 1

| Sample No. | Epoxy Resin | Curing Agent | Accelerator | Filler (Content) | Carbon Black (Content) |
|---|---|---|---|---|---|
| 1 | HP-4032D | B-570 | 2P4 MHZ | FB-5SDX (65%) | — (0%) |
| 2 | HP-4032D | QH-200 | 2P4 MHZ | FB-5SDX (65%) | #4400 (0.1%) |
| 3 | E-807 | B-570 | 2P4 MHZ | FB-5SDX (65%) | #4400 (0.2%) |
| 4 | YL-980 | YH-306 | 2P4 MHZ | FB-5SDX (65%) | #4400 (0.3%) |
| 5 | HP-4032D | B-650 | 2P4 MHZ | FB-5SDX (65%) | #4400 (0.5%) |
| 6 | N-740 | YH-300 | 2P4 MHZ | FB-5SDX (65%) | #4400 (1.0%) |
| 7 | HP-4032D | YH-300 | 2P4 MHZ | FB-5SDX (65%) | #4400 (1.5%) |
| 8 | E-152 | B-650 | 2P4 MHZ | FB-5SDX (65%) | #4400 (2.0%) |
| 9 | N-740 | B-650 | 2P4 MHZ | FB-5SDX (65%) | #4400 (2.5%) |

Epoxy resin:
"HP-4032D": High-pure naphthalene type epoxy resin (manufactured by DAINIPPON INK & CHEMICALS, INC.)
"E-807": Bisphenol F type epoxy resin (manufactured by Yuka Shell Epoxy Co., Ltd.)
"YL-980": Bisphenol A type epoxy resin (manufactured by Yuka Shell Epoxy Co., Ltd.)
"N-740": Phenolnovolac type epoxy resin (manufactured by DAINIPPON INK & CHEMICALS, INC.)
Curing agent:
"QH-200": Acid anhydride-base curing agent (manufactured by Nippon Zeon Co., Ltd.)
"B-570": Acid anhydride-base curing agent (Manufactured by DIC)
"B-650": Acid anhydride-base curing agent (Manufactured by DIC)
"YH-306": Acid anhydride-base curing agent (Manufactured by Yuka Shell Epoxy Co., Ltd.)
"YH-300": Acid anhydride-base curing agent (Manufactured by Yuka Shell Epoxy Co., Ltd.)
Accelerator (curing accelerator)
"2P4 MHZ": Imidazole-base curing agent (manufactured by Shikoku Chemicals Corporation)
Inorganic filler
"FB-5SDX": Spherical silica filler (manufactured by DENKI KAGAKU KOGYO K.K.)
Silane coupling treated. Carbon black
"#4400": Manufactured by TOKAI CARBON CO., LTD.

"Filler content" and "Carbon content" each is the value when the sum total of the epoxy resin, the curing agent, and the filler is 100% by mass. "Accelerator" is 0.1% by mass when the sum total of the epoxy resin, the curing agent, and the filler is 100% by mass. The ratio of the epoxy resin and the curing agent is 100/95 as the functional group ratio. About these compositions, the following reliability evaluation is carried out.

sample after passing each hour with a width of 10 mm. The copper plated layer (9) is peeled off by pulling in the vertical direction to the substrate according to JIS C 5012. The force required for peeling off is defined as the peeling strength. It is preferred that the peeling strength is at least 588 N/m (0.6 kg/cm). The measurement results are shown in Table 2.

TABLE 2

| Sample No. | Peeling Strength before PCT (N/m) Blister Generating Ratio (%) | Peeling Strength after OCT 84 Hours (N/m) Blister Generating Ratio (%) | Peeling Strength after OCT 168 Hours (N/m) Blister Generating Ratio (%) | Peeling Strength after OCT 336 Hours (N/m) Blister Generating Ratio (%) | Volume Resistance ($\Omega \cdot$ cm) |
|---|---|---|---|---|---|
| 1 | 735 / 0 | 735 / 0 | 735 / 0 | 657 / 0 | $1.54 \times 10^{15}$ |
| 2 | 755 / 0 | 755 / 0 | 735 / 0 | 666 / 0 | $5.30 \times 10^{15}$ |
| 3 | 745 / 0 | 755 / 0 | 725 / 0 | 657 / 0 | $2.22 \times 10^{15}$ |
| 4 | 735 / 0 | 735 / 0 | 715 / 0 | 617 / 0 | $1.46 \times 10^{15}$ |
| 5 | 735 / 0 | 725 / 0 | 725 / 0 | 490 / 4 | $1.47 \times 10^{15}$ |
| 6 | 686 / 0 | 666 / 0 | 480 / 8 | 343 / 8 | $7.82 \times 10^{15}$ |
| 7 | 676 / 0 | 617 / 0 | 441 / 8 | 294 / 16 | $1.71 \times 10^{15}$ |
| 8 | 647 / 0 | 549 / 4 | 441 / 12 | 304 / 12 | $9.82 \times 10^{14}$ |
| 9 | 637 / 0 | 529 / 4 | 392 / 12 | 274 / 12 | $9.25 \times 10^{9}$ |

PCT: Pressure Cooker Test (Reliability Evaluation)

As the core substrate, a BT substrate having a thickness of 0.8 mm is used. A throughhole of a definite size is formed in the core substrate by punching using a metal mold. As shown in FIG. 2, after sticking a backing tape (3) to one surface of the core substrate (1), the substrate is placed with the surface having the backing tape (3) at the lower side. Then, as shown in FIG. 3, from another side of the core substrate, chip capacitors (4) are disposed on a definite position on the sticky surface of the backing tape (3) in the opening (2) using a chip mounter. As shown in FIG. 4, the embedding resin (6) shown in Table 4 is poured into the gaps among the chip capacitors (4) disposed in the opening (2) and the opening (2) using a dispenser.

The embedding resin (6) is defoamed and thermally cured under the conditions of 100° C.×80 minutes→120° C.×60 minutes→160° C.×10 minutes. As shown in FIG. 5, after roughly abrading the surface (60) of the cured embedding resin (6) using a belt sander, the surface was finish-abraded by a rap abrasion. Then, as shown in FIG. 6, via holes (7) are formed in the flatted surface (60) using a carbon dioxide gas laser to expose the electrodes (5) of the chip capacitors (4).

Thereafter, using a swelling solution and a solution of $KMnO_4$, the exposed surfaces of the embedding resin (6) are roughened. After Pd catalyst activating the roughened surface (61) obtained, as shown in FIG. 7, copper plating (9) is applied in the order of electroless plating and electrolytic plating. About each sample, a moisture resistance test was carried out in the time shown in Table 2 using a pressure cooker test under the definite conditions (121° C., humidity of 100% by mass, and 2.1 atm.). Then, cuts were formed in the copper plated layer (9) on the embedding resin of the From the results, it can be seen that the embedding resins of sample nos. 1 to 5, which are examples of the invention, and the wirings substrates using the resins can keep good peeling strengths even after the pressure cooker test under the definite conditions. Particularly, it can be seen that by controlling the addition amount of carbon black to the definite range, the insulating property can be also improved. On the other hand, when the addition amount is too much as sample Nos. 6 to 9, which are comparative examples, not only the insulating resistance but also the reliability of the peeling strength are lowered.

According to the present invention, in the case of embedding electronic parts disposed in the openings (throughhole and concave portions such as cavities) formed in the substrate using the embedding resin of the invention, even by applying the pressure cooker test of the definite conditions, the adhesion reliability of a high peeling strength can be insured. In the case of forming a fine wiring layer having a width of not wider than 150 µm on the embedding resin and in the case of forming a wiring layer passing a large electric current as a powder source layer on the resin, remarkable effects are obtained. Particularly, in the case of forming a wiring layer for power source layer connected to an electronic part such as a capacitor, etc., having power Source supplying function, a high adhesive reliability can be insured.

This application is based on Japanese patent applications JP 2000-395627, filed Dec. 26, 2000, JP 2001-83984, filed Mar. 23, 2001, and JP 2001-352505, filed Nov. 19, 2001, the entire contents of each of which are hereby incorporated by reference, the same as if set forth at length.

What is claimed is:

1. An embedding resin for embedding electronic parts, wherein after a substrate in which a copper layer is formed on a cured product of the embedding resin is subjected to a pressure cooker test, the copper layer has a peeling strength of at least 588 N/m (0.6 kg/cm), wherein the conditions of the pressure cooker test are 121° C., 100% by mass humidity, 2.1 atm and 168 hours, and the measurement method of the peeling strength is according to JIS C 5012, and the width of the copper layer is 10 mm.

2. An embedding resin for embedding electronic parts, wherein after a substrate in which a copper layer is formed on a cured product of the embedding resin is subjected to a pressure cooker test, the copper layer has a peeling strength of at least 600 N/n (0.61 kg/cm), wherein the conditions of the pressure cooker test are 121° C., 100% by mass humidity, 2.1 atm and 336 hours, and the measurement method of the peeling strength is according to JIS C 5012, and the width of the copper layer is 10 mm.

3. The embedding resin according to claim 1, which contains carbon black in an amount of not more than 0.5% by mass.

4. The embedding resin according to claim 1, which contains carbon black in an amount of not m0rre than 0.4% by mass.

5. The embedding resin according to claim 1, which comprises a thermosetting resin and at least one inorganic filler.

6. The embedding resin according to claim 5, wherein the thermoplastic resin comprises at least one selected from a bisphenol epoxy resin, a naphthalene epoxy resin, a phenol-novolac epoxy resin, and a cresol novolac epoxy resin.

7. A wiring substrate comprising at least one electric part embedded in an embedding resin according to claim 1.

8. A wiring substrate comprising at least one electric part embedded in an embedding resin according to claim 1.

9. A wiring substrate comprising: a core substrate; and a build-up layer provided on at least one side of the core substrate and formed by alternately laminating an insulating layer and a wiring layer, wherein at least one of the core substrate and the build-up layer has an opening penetrating therethrough, and an electronic part is disposed in the opening and embedded with an embedding resin according to claim 1.

10. A wiring substrate comprising: a core substrate; and a build-up layer provided on at least one side of the core substrate and formed by alternately laminating an insulating layer and a wiring layer, wherein at least one of the core substrate and the build-up layer has an opening penetrating therethrough, and an electronic part is disposed in the opening and embedded with an embedding resin according to claim 1.

* * * * *